(12) United States Patent
Ohazama

(10) Patent No.: US 10,707,428 B2
(45) Date of Patent: Jul. 7, 2020

(54) LIGHT EMITTING DEVICE, ELECTRONIC DEVICE, AND METHOD FOR MANUFACTURING LIGHT EMITTING DEVICE

(71) Applicants: PIONEER CORPORATION, Bunkyo-ku, Tokyo (JP); TOHOKU PIONEER CORPORATION, Tendo-shi, Yamagata (JP)

(72) Inventor: Hidetaka Ohazama, Yonezawa (JP)

(73) Assignees: PIONEER CORPORATION, Bunkyo-Ku, Tokyo (JP); TOHOKU PIONEER CORPORATION, Tendo-Shi, Yamagata (JP)

( * ) Notice: Subject to any disclaimer, the term of this patent is extended or adjusted under 35 U.S.C. 154(b) by 0 days.

(21) Appl. No.: 16/087,594

(22) PCT Filed: Mar. 23, 2016

(86) PCT No.: PCT/JP2016/059189
§ 371 (c)(1),
(2) Date: Sep. 21, 2018

(87) PCT Pub. No.: WO2017/163331
PCT Pub. Date: Sep. 28, 2017

(65) Prior Publication Data
US 2019/0097146 A1    Mar. 28, 2019

(51) Int. Cl.
*H01L 51/00* (2006.01)
*H01L 51/50* (2006.01)
(Continued)

(52) U.S. Cl.
CPC ...... *H01L 51/0097* (2013.01); *H01L 51/5012* (2013.01); *H01L 51/5203* (2013.01);
(Continued)

(58) Field of Classification Search
CPC combination set(s) only.
See application file for complete search history.

(56) References Cited

U.S. PATENT DOCUMENTS

| 7,378,685 B2 | 5/2008 | Lee et al. |
| 9,153,636 B2 | 10/2015 | Tanaka |

(Continued)

FOREIGN PATENT DOCUMENTS

| JP | 2004-258487 A | 2/2003 |
| JP | 2005-284252 A | 10/2004 |

(Continued)

OTHER PUBLICATIONS

International Search Report for related International Application No. PCT/JP2016/059189, dated Jun. 21, 2016; 2 pages.

*Primary Examiner* — Matthew L Reames
(74) *Attorney, Agent, or Firm* — Procopio, Cory, Hargreaves & Savitch LLP

(57) ABSTRACT

A light-emitting unit (140) is formed on one surface (101) of a substrate (100). Further, the light-emitting unit (140) includes a first electrode (110), an organic layer (120), and a second electrode (130). A covering member (180) covers the light-emitting unit (140). An integrated circuit (300) is arranged on the one surface (101) of the substrate (100). In addition, the integrated circuit (300) is electrically connected to at least one of the first electrode (110) and the second electrode (130). A protective member (400) is located in a region (105) between the covering member (180) and the integrated circuit (300). Further, the protective member (400) is provided so as to expose the entirety of a first surface (301) of the integrated circuit (300) on a side opposite to the substrate (100).

14 Claims, 17 Drawing Sheets

(51) Int. Cl.
*H01L 51/52* (2006.01)
*H01L 51/56* (2006.01)

(52) U.S. Cl.
CPC .......... *H01L 51/5246* (2013.01); *H01L 51/56* (2013.01); *H01L 2251/5338* (2013.01); *H01L 2251/5361* (2013.01)

(56) References Cited

U.S. PATENT DOCUMENTS

| | | |
|---|---|---|
| 9,530,831 B2 | 12/2016 | Lee et al. |
| 9,773,853 B2 * | 9/2017 | Tao ..................... H01L 51/0097 |
| 2005/0211990 A1 | 9/2005 | Lee et al. |
| 2014/0183473 A1 | 7/2014 | Lee et al. |
| 2015/0137098 A1 | 5/2015 | Tanaka |
| 2016/0093683 A1 | 3/2016 | Lee et al. |
| 2017/0062773 A1 | 3/2017 | Lee et al. |

FOREIGN PATENT DOCUMENTS

| | | |
|---|---|---|
| JP | 2010-140786 A | 12/2008 |
| JP | 2010-027502 A | 2/2010 |
| JP | 2015-121777 A | 7/2015 |
| WO | 2006-088185 A1 | 2/2006 |

* cited by examiner

50

US 10,707,428 B2

LIGHT EMITTING DEVICE, ELECTRONIC DEVICE, AND METHOD FOR MANUFACTURING LIGHT EMITTING DEVICE

CROSS-REFERENCE TO RELATED APPLICATIONS

This application is a U.S. National Stage entry of PCT Application No: PCT/JP2016/059189 filed Mar. 23, 2016, the contents of which are incorporated herein by reference.

TECHNICAL FIELD

The present invention relates to a light-emitting device, an electronic device, and a method for manufacturing the light-emitting device.

BACKGROUND ART

In recent years, there has been progress in the development of light-emitting devices using organic EL. Such light-emitting devices are used as illumination devices or display devices and configured of an organic layer interposed between a first electrode and a second electrode. In addition, flexible light-emitting devices using a substrate made of resin or a thin glass plate are being developed.

Patent Document 1 describes improving the strength in a major portion of a transparent substrate by covering, with a protective member, a large portion of the transparent substrate other than a portion on which a semiconductor chip and a flexible printed circuit board are mounted.

RELATED ART DOCUMENT

Patent Document

[Patent Document 1]: Japanese Unexamined Patent Application Publication No. 2010-27502

SUMMARY OF THE INVENTION

Particularly in a case where a glass substrate is used, since there is less intrusion of deterioration factors in a light-emitting unit compared to a resin substrate, the life of the light-emitting unit using a glass substrate can be extended. However, on the other hand, there is a problem that durability of the substrate is inferior in a curved state. When the substrate is curved, a stress was concentrated particularly between an integrated circuit and a sealing member provided on the substrate, and the stress tended to be a cause of a crack or the like.

An example of the problem to be solved by the present invention is to improve the durability of a flexible light-emitting device.

Means for Solving the Problem

The invention described in claim 1 is a light-emitting device including:

a substrate;

a light-emitting unit provided on one surface of substrate, the light-emitting unit including a first electrode, an organic layer, and a second electrode;

a covering member which covers the light-emitting unit;

an integrated circuit disposed on the one surface, the integrated circuit electrically connected to at least one of the first electrode and the second electrode; and a protective member located in a region between the covering member and the integrated circuit, in which the protective member is provided on a side of the integrated circuit opposite to the substrate so as to expose the entirety of a first surface of the integrated circuit.

The invention described in claim 14 is an electronic device including:

a light-emitting device described in any one of claims 1 to 13, in which at least a portion of the substrate is curved.

The invention described in claim 15 is a method for manufacturing a light-emitting device including the steps of:

forming a light-emitting unit including a first electrode, an organic layer, and a second electrode on one surface of a substrate;

providing an integrated circuit on the surface, the integrated circuit electrically connected to at least one of the first electrode and the second electrode;

covering the light-emitting unit with a covering member; and forming a protective member in a region between the covering member and the integrated circuit, in which in the step of forming the protective member, the protective member is provided on the integrated circuit on a side opposite to the substrate so as to expose the entirety of a first surface of the integrated circuit.

BRIEF DESCRIPTION OF THE DRAWINGS

The objects described above, and other objects, features and advantages are further made apparent by a suitable embodiment that will be described below and the following accompanying drawings.

DESCRIPTION OF EMBODIMENT

Figure 1:
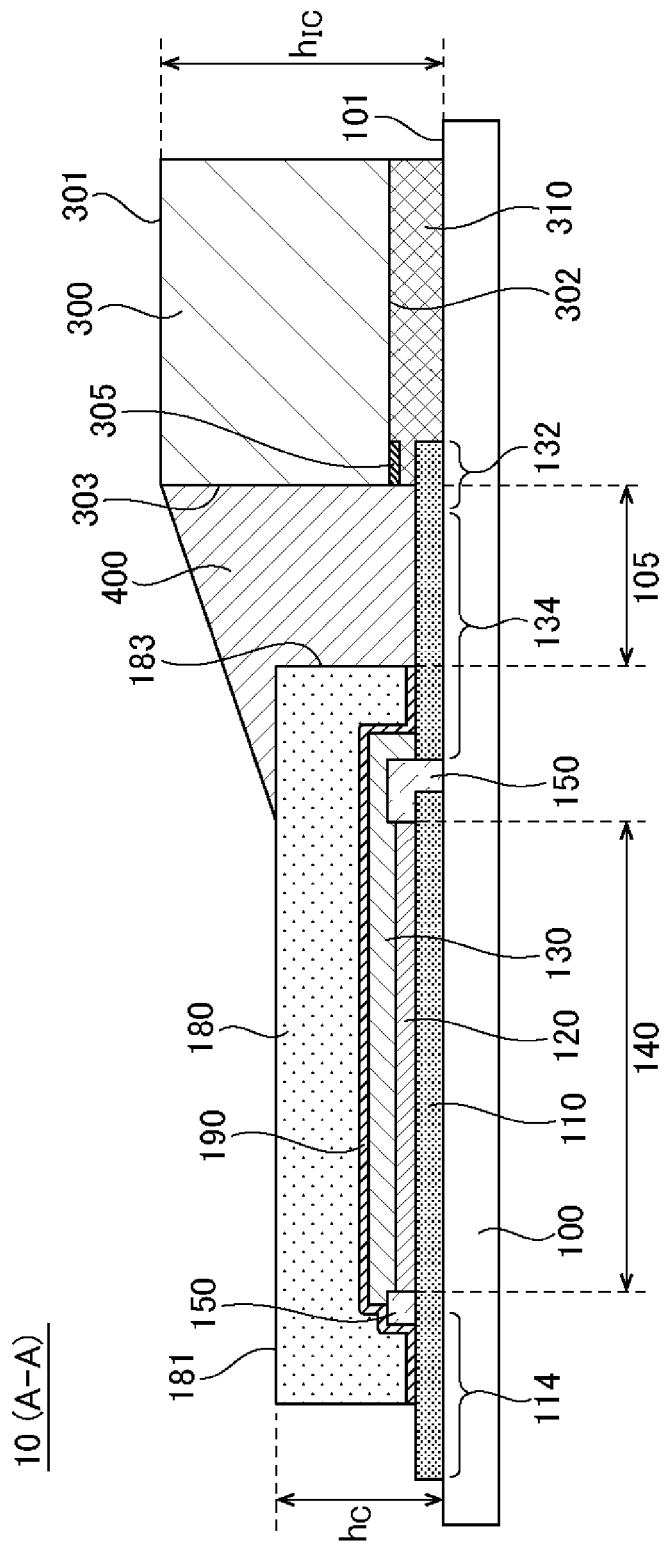
FIG. 1 is a cross-sectional view of a configuration of a light-emitting device according to an embodiment.

An embodiment of the present invention will be described below by referring to the drawings. Moreover, in all the drawings, the same constituent elements are given the same reference numerals, and descriptions thereof will not be repeated.

Figure 2:
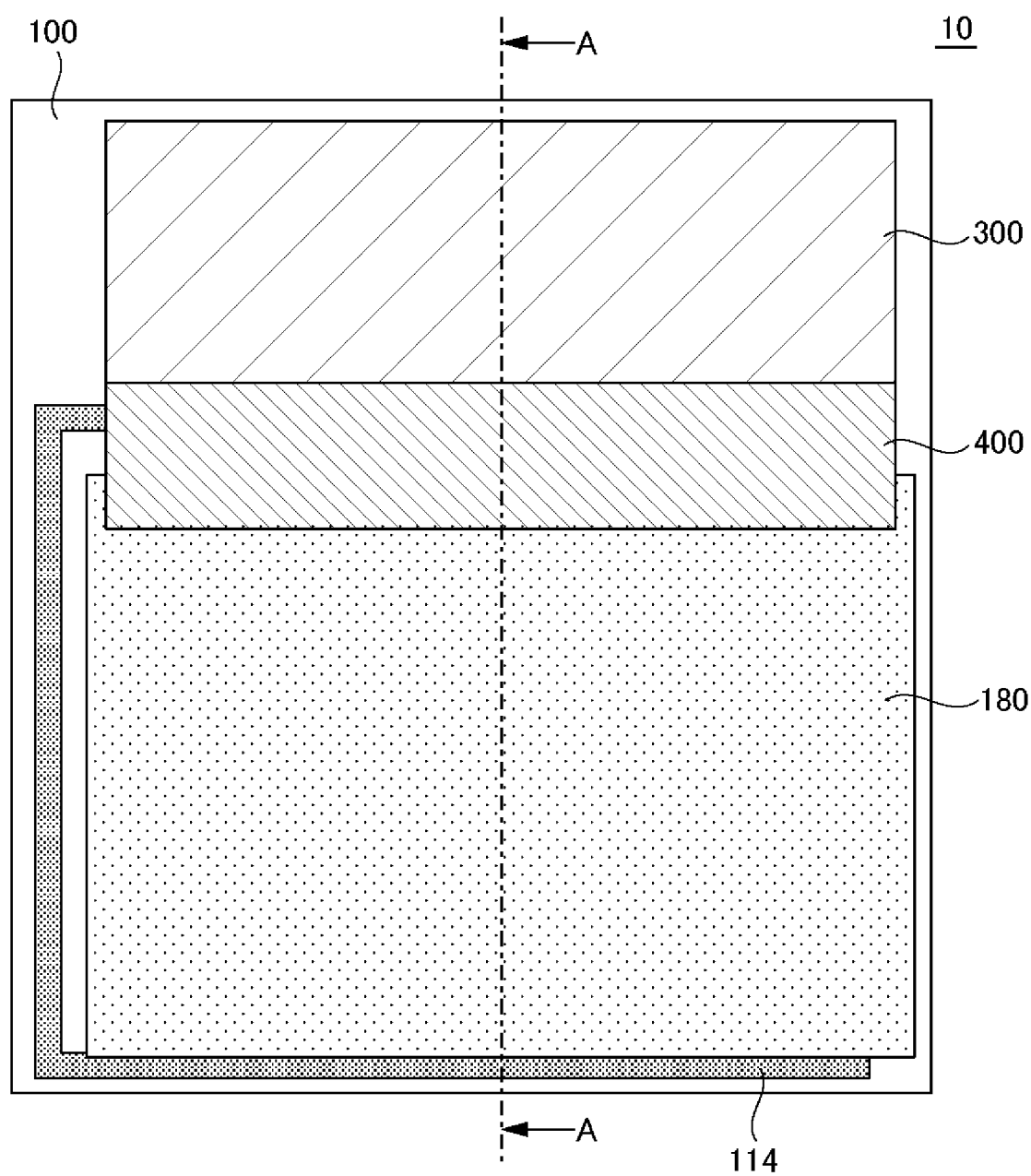
FIG. 2 is a plan view of a configuration of the light-emitting device according to the embodiment.

FIG. 1 is a cross-sectional view of a configuration of a light-emitting device 10 according to the present embodiment, and FIG. 2 is a plan view of the configuration of the light-emitting device 10 according to the present embodiment. FIG. 1 is a cross-sectional view taken along line A-A of FIG. 2.

The light-emitting device 10 according to the present embodiment includes a substrate 100, a light-emitting unit 140, a covering member 180, an integrated circuit 300, and a protective member 400. The light-emitting unit 140 is formed on one surface (hereinafter also referred to as "a first surface") 101 of the substrate 100. In addition, the light-emitting unit 140 includes a first electrode 110, an organic layer 120, and a second electrode 130. The covering member 180 covers the light-emitting unit 140. The integrated circuit 300 is disposed on the one surface 101 of the substrate 100. Further, the integrated circuit 300 is electrically connected to at least one of the first electrode 110 and the second electrode 130. The protective member 400 is located in a first region 105 between the covering member 180 and the integrated circuit 300. In addition, the protective member 400 is provided on the integrated circuit 300 on a side opposite to the substrate 100 so as to expose the entirety of a first surface 301. A detailed description will be provided below.

The substrate 100 of the light-emitting device 10 is formed by a light-transmitting material such as, for example, glass or a resin which has optical transparency. However, in a case where the light-emitting device 10 is a later-described top emission light-emitting device, the substrate 100 may be formed of a non-light-transmitting material. The substrate 100 is polygonal, for example, rectangular. Here, the substrate 100 has flexibility. The thickness of the substrate 100 is, for example, equal to or greater than 10 μm and equal to or less than 1,000 μm. Particularly in a case where the substrate 100 is a glass substrate having flexibility, the thickness of the substrate 100 is, for example, equal to or less than 200 μm. In a case where the substrate 100 is made to have flexibility using a resin material, the substrate 100 is formed using a material in which, for example, polyethylene naphthalate (PEN), polyether sulphone (PES), polyethylene terephthalate (PET), or polyimide is contained. In addition, in a case where the substrate 100 contains the resin material, an inorganic barrier film of $SiN_x$, SiON, or the like is formed on at least a light-emitting surface (preferably, both surfaces) of the substrate 100 in order to prevent moisture from permeating the substrate 100.

The light-emitting unit 140 is formed on the substrate 100. The light-emitting unit 140 includes a structure to generate light emission, for example, an organic EL element. This organic EL element has a configuration in which the first electrode 110, the organic layer 120, and the second electrode 130 are laminated in this order.

Figure 3:
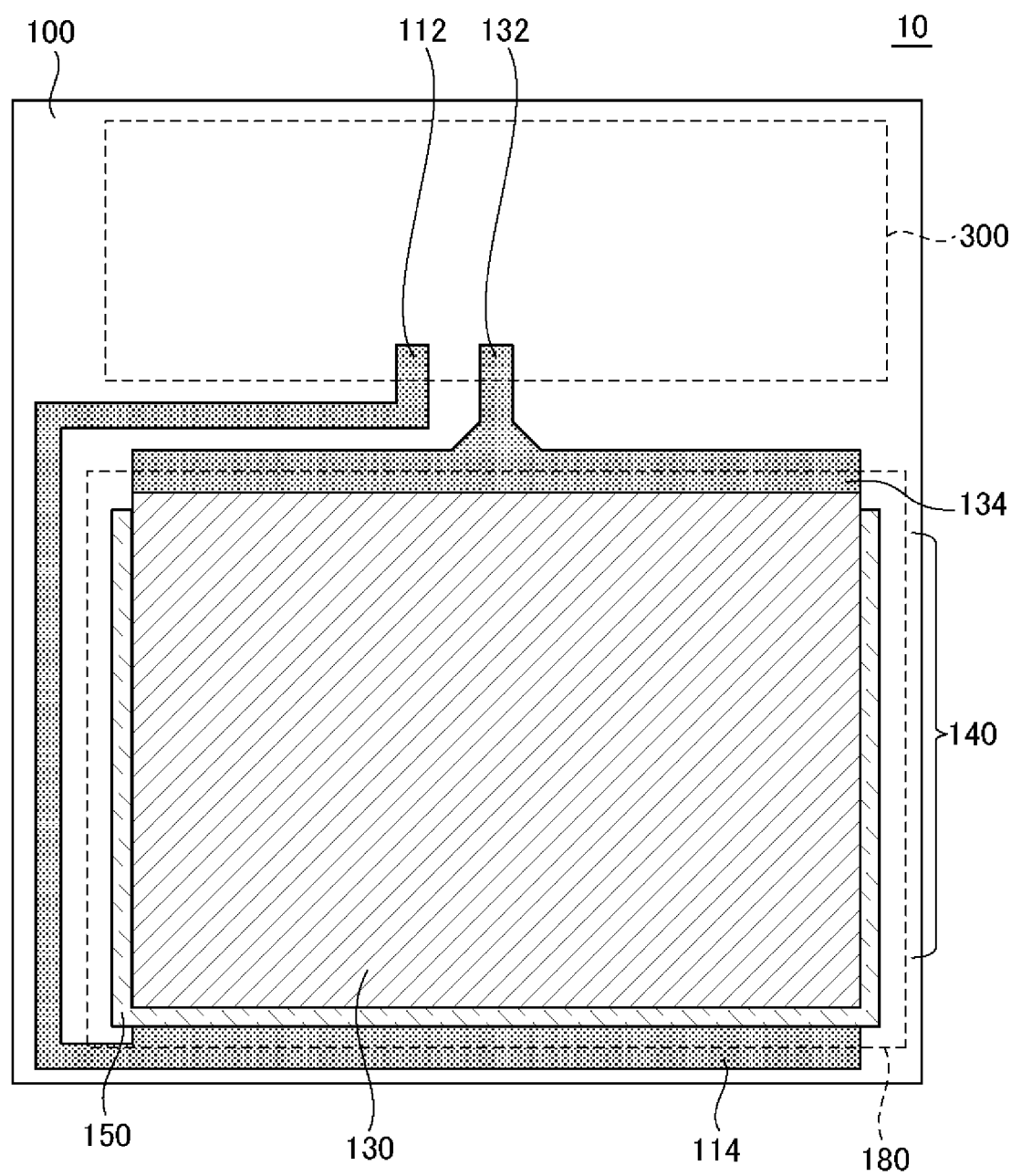
FIG. 3 is a diagram in which a protective member, an integrated circuit, a covering member, and a sealing member are removed from FIG. 2.
Figure 4:
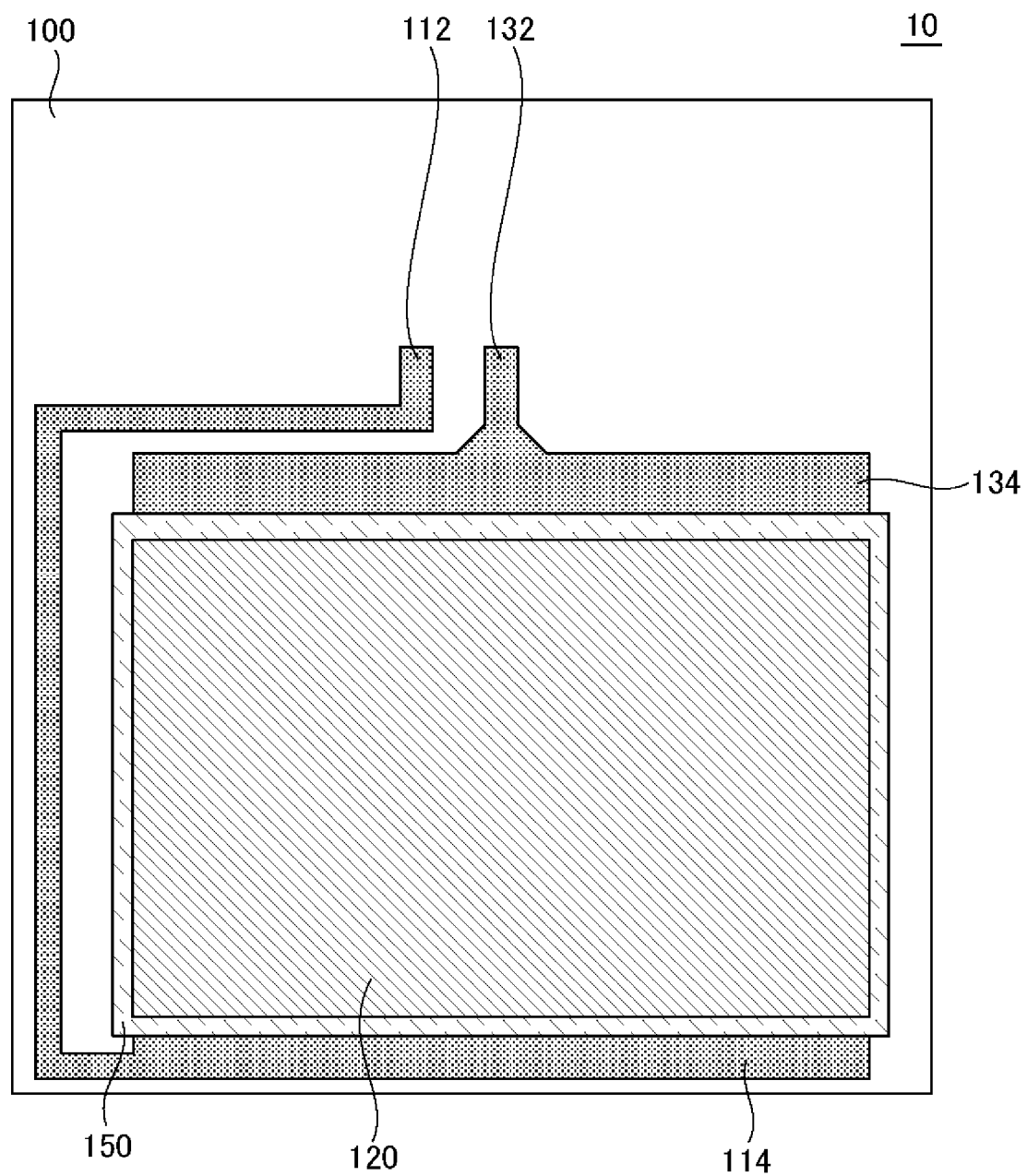
FIG. 4 is a diagram in which a second electrode is removed from FIG. 3.
Figure 5:
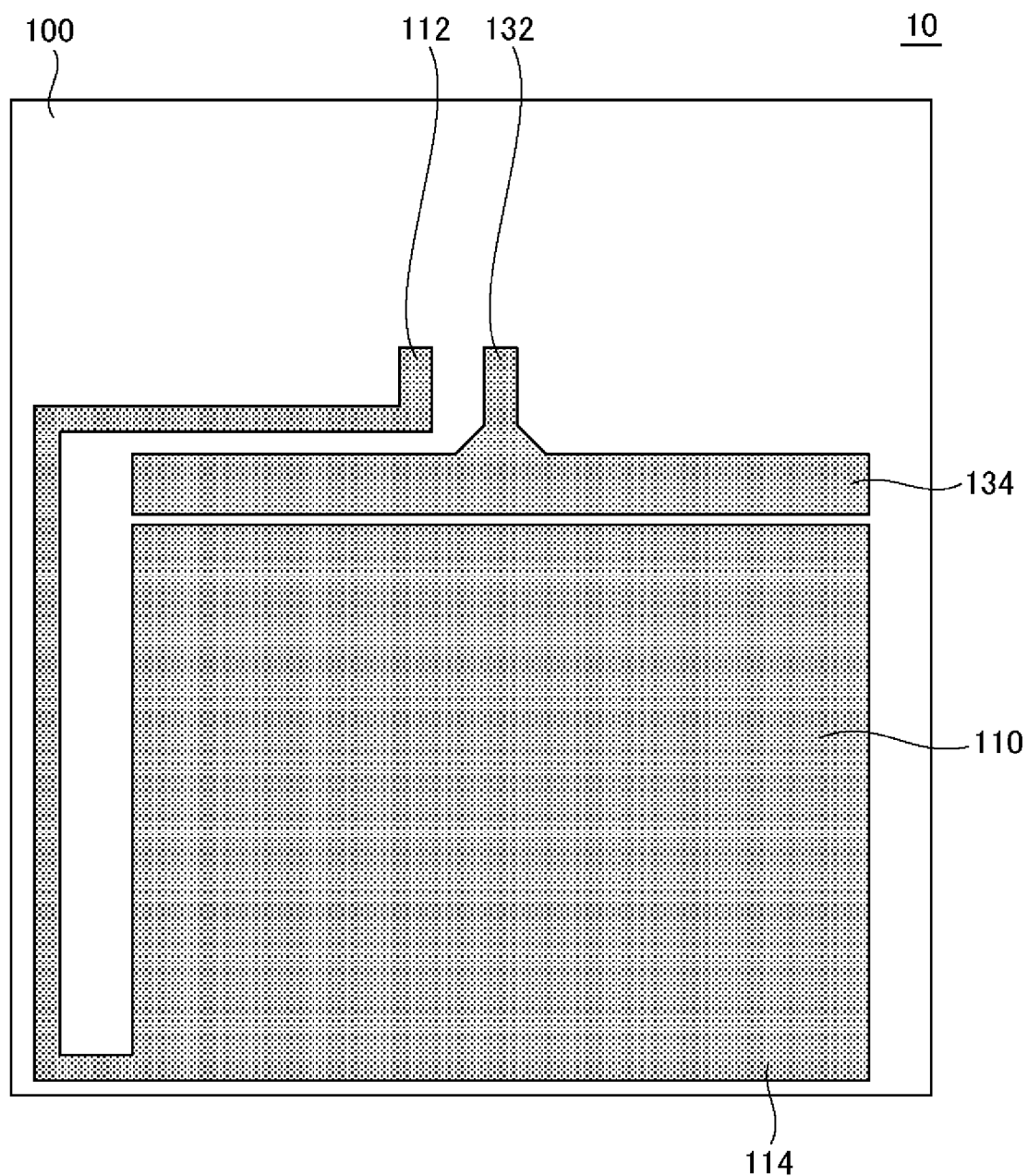
FIG. 5 is a diagram in which an insulating layer and an organic layer are removed from FIG. 4.

A configuration of the light-emitting unit 140 will be described in detail referring to FIG. 3 to FIG. 5. FIG. 3 is a diagram in which the protective member 400, the integrated circuit 300, the covering member 180, and the sealing film 190 are removed from FIG. 2. In the present drawing, the integrated circuit 300 and the covering member 180 are illustrated with a dotted line. FIG. 4 is a diagram in which the second electrode 130 is removed from FIG. 3. FIG. 5 is a diagram in which an insulating film 150 and the organic layer 120 are removed from FIG. 4.

The first electrode 110 is a transparent electrode having optical transparency. A transparent conductive material composing the transparent electrode is a material containing a metal, for example, a metal oxide such as an indium tin oxide (ITO), an indium zinc oxide (IZO), an indium tungsten zinc oxide (IWZO), a zinc oxide (ZnO), or the like. The thickness of the first electrode 110 is, for example, equal to or greater than 10 nm and equal to or less than 500 nm. The first electrode 110 is formed by, for example, sputtering or vapor deposition. Meanwhile, the first electrode 110 may be a conductive organic material such as carbon nanotubes or PEDOT/PSS.

The light-emitting device 10 further includes an insulating film 150. The insulating film 150 defines the light-emitting unit 140. The insulating layer 150 is formed of a photosensitive resin material such as, for example, polyimide, and surrounds a portion of the first electrode 110, the portion serving as the light-emitting unit 140. A portion of the second electrode 130 is located over the insulating film 150. In addition, when viewed from a direction perpendicular to the substrate 100, a portion of the insulating layer 150 protrudes from the second electrode 130.

The second electrode 130 includes a metal layer composed of a metal selected from a first group consisting of, for example, Al, Au, Ag, Pt, Mg, Sn, Zn, and In, or an alloy of metals selected from the first group. In this case, the second electrode 130 has light shielding properties. The thickness of the second electrode 130 is, for example, equal to or greater than 10 nm and equal to or less than 500 nm. However, the second electrode 130 may be formed using a material exemplified as the material of the first electrode 110. The second electrode 130 is formed by, for example, sputtering or vapor deposition.

Meanwhile, the above mentioned materials of the first electrode 110 and the second electrode 130 are examples of a case where the substrate 100 transmits light, that is, a case where light emitted from the light-emitting device 10 is transmitted through the substrate 100 (that is, a bottom-emission type). As another case, there is a case where the light is transmitted through a side opposite to the substrate 100. That is, the case is when the light emitted from the light-emitting device 10 is not transmitted through the substrate 100 (that is, a top-emission type). In the top-emission type, any of two kinds of laminated structures of an inverted stacked structure and a regular stacked structure may be adopted. In the inverted stacked structure, a material of the first electrode 110 and a material of the second electrode 130 are inverted from those of the bottom-emission type. That is, as the material of the first electrode 110, the above-mentioned material of the second electrode 130 is used, and as the material of the second electrode 130, the above-mentioned material of the first electrode 110 is used. On the other hand, the regular stacked structure is a structure to extract light from the side opposite to the substrate 100 by forming the material of the first electrode 110 on the above-mentioned material of the second electrode 130, and further forming the organic layer 120 thereon, and still further forming a thinly formed second electrode 130 thereon. Meanwhile, the material to be thinly formed is, for example, a material exemplified as the material of the second electrode 130, or an MgAg alloy, or the like. In a case of using Al or Ag, the thickness of the second electrode 130 is preferably equal to or less than 30 nm. The light-emitting device 10 according to the present embodiment may have any structure of a bottom-emission type and the above-mentioned two kinds of the top-emission type.

The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed by vapor deposition. In addition, at least one layer of the organic layer 120, for example, a layer which is in contact with the first electrode 110, may be formed using a coating method such as ink jetting, printing, or spraying. Meanwhile, in this case, the remaining layers of the organic layer 120 are formed by vapor deposition. In addition, all layers of the organic layer 120 may be formed using a coating method.

The light-emitting unit 140 is sealed by the sealing film 190 (See FIG. 1). The sealing film 190 is formed on a surface of the substrate 100 having at least the light-emitting unit 140 thereon, and covers the light-emitting unit 140. However, a later-described first terminal 112 and a second terminal 132 are not covered by the sealing film 190. The sealing film 190 is formed by, for example, an insulating material, and more specifically, an inorganic material such as an aluminum oxide, a titanium oxide, or the like. Further, the thickness of the sealing film 190 is preferably equal to or less than 300 nm. In addition, the thickness of the sealing film 190 is, for example, equal to or greater than 50 nm.

The sealing film 190 is formed by, for example, ALD (Atomic Layer Deposition). In this case, step coverage of the sealing film 190 is high. Further in this case, the sealing film 190 may have a multilayer structure in which plural layers are laminated. In this case, the sealing film 190 may be configured by repeatedly laminating a first sealing layer composed of a first material (for example, aluminum oxide), and a second sealing layer composed of a second material (for example, titanium oxide). The lowermost layer may be any of the first sealing layer and the second sealing layer. The uppermost layer may also be any of the first sealing layer and the second sealing layer. In addition, the inorganic film 190 may be a single layer in which the first material and the second material are mixed.

However, the sealing film 190 may be formed using another film formation method, for example, CVD or sputtering. In this case, the sealing film 190 is formed of an insulating film such as $SiO_2$, SiN, or the like, and the thickness thereof is, for example, equal to or greater than 10 nm and equal to or less than 1,000 nm.

In addition, a covering member 180 to protect the sealing film 190 is further provided on the sealing film 190. The covering member 180 is formed using an epoxy resin, an acrylic resin, or the like. The covering member 180 may or may not have a sealing function.

Meanwhile, the covering member 180 may be formed of glass or resin which has optical transparency. In such a case, the covering member 180 is polygonal or round, similarly to the substrate 100, and fixed to the light-emitting unit 140 through an adhesive layer. In addition, the covering member 180 may have a configuration in which a concave portion is provided in the center. In this case, the edges of the covering member 180 are fixed to the substrate 100 with an adhesive. Thereby, a space surrounded by the covering member 180 and the substrate 100 is sealed. In addition, the light-emitting unit 140 is located in the sealed space. Meanwhile, the sealing film 190 need not be provided.

In addition, a desiccant may be disposed in the space sealed by the covering member 180. The desiccant contains a desiccant member, for example, CaO, BaO, or the like. For example, the desiccant is fixed to a surface of the covering member 180 facing the substrate 100.

In addition, the light-emitting device 10 is formed on a first surface 101 of the substrate 100 and further includes a terminal electrically connected to the first electrode 110 or the second electrode 130. In the example of the present drawing, the light-emitting device 10 includes a first terminal 112, a first extraction interconnect 114, a second terminal 132, and a second extraction interconnect 134. The first terminal 112 and the second terminal 132 are the above-mentioned terminals. All of the first terminal 112, the first extraction interconnect 114, the second terminal 132, and the second extraction interconnect 134 are formed on the same surface of the substrate 100 as a surface having the light-emitting unit 140 thereon. The first terminal 112 and the second terminal 132 are located outside the covering member 180. The first extraction interconnect 114 connects the first terminal 112 and the first electrode 110, and the second extraction interconnect 134 connects the second terminal 132 and the second electrode 130. In other words, both the first extraction interconnect 114 and the second extraction interconnect 134 extend from the inside of the covering member 180 to the outside thereof.

The first terminal 112, the second terminal 132, the first extraction interconnect 114, and the second extraction interconnect 134 include, for example, a layer formed of the same material as that of the first electrode 110. Further, at least one portion of at least one of the first terminal 112, the second terminal 132, the first extraction interconnect 114, and the second extraction interconnect 134 may include a metal film (not shown in the drawing) having a resistance lower than that of the first electrode 110 thereon. The metal film need not be formed on all of the first terminal 112, the second terminal 132, the first extraction interconnect 114, and the second extraction interconnect 134. The layer formed using the same material as that of the first electrode, out of the first terminal 112, the first extraction interconnect 114, the second terminal 132, and the second extraction interconnect 134, is formed by the same process as that of the first electrode 110. Therefore, the first electrode 110 is formed integrally with at least a portion of layers of the first terminal 112. Further, in a case where these include a metal film, the light transmittance of the first terminal 112, the first extraction interconnect 114, the second terminal 132, and the second extraction interconnect 134 is lower than that of the substrate 100.

Referring back to FIG. 1, the integrated circuit 300 includes a plurality of electrodes 305 on the surface thereof facing the substrate 100. The plurality of electrodes 305 include a positive electrode terminal and a negative electrode terminal of the integrated circuit 300. In addition, the first terminal 112 and the second terminal 132 are electrically connected to the electrodes 305 of the integrated circuit 300 through an anisotropic conductive resin layer 310. The anisotropic conductive resin layer 310 has a configuration in which a plurality of conductive particles are mixed into a resin having insulating properties. The conductive particles are, for example, metal particles. However, they may also be particles having insulating properties such as resin particles or the like having a metal such as gold deposited on the surface thereof. The first terminal 112 is connected to the positive electrode terminal of the integrated circuit 300, and the second terminal 132 is connected to the negative electrode terminal of the integrated circuit 300, and as a result, electricity flows between the first terminal 112 and the second terminal 132, and the integrated circuit 300. Further, the integrated circuit 300 is fixed to the substrate 100 through the anisotropic conductive resin layer 310.

In a case where the light-emitting device 10 includes a plurality of light-emitting units 140, one first extraction interconnect 114 and one second extraction interconnect 134 are formed for each light-emitting unit 140. Each of a plurality of the first extraction interconnects 114 is connected to the same first terminal 112, and each of a plurality of the second extraction interconnects 134 is connected to the same second terminal 132. However, the one first extraction interconnect 114 and the one second extraction interconnect 134 may be formed for the plurality of light-emitting units 140. In addition, one first extraction interconnect 114 may be connected to each first terminal 112, and one second extraction interconnect 134 may be connected to each second terminal 132.

The integrated circuit 300 is, for example, a semiconductor integrated circuit (IC), and functions as a control circuit of the light-emitting unit 140. The integrated circuit 300 is fixed so that a second surface 302 on the side opposite to the first surface 301 faces the first surface 101 of the substrate 100. There is no particular limitation to the shape or size of the integrated circuit 300, however, for example, a height $h_C$ from the first surface 101 of the substrate 100 to a first surface 181 of the covering member 180 on the side opposite to the substrate 100 is lower than a height $h_{IC}$ from the first surface 101 of the substrate 100 to the first surface 301 of the integrated circuit 300 on the side opposite to the substrate 100. The integrated circuit 300 includes the plurality of electrodes 305, and as mentioned above, is electrically connected to the first electrode 110 or the terminal connected to the second electrode 130 (the first terminal 112 and the second terminal 132).

The light-emitting device 10 may include a plurality of the integrated circuits 300 on the first surface 101 of the substrate 100. In such a case, the protective member 400 is provided in each region between the integrated circuit 300 and the covering member 180.

As mentioned above, the protective member 400 is located in the first region 105 between the covering member 180 and the integrated circuit 300. The protective member 400 preferably covers the entirety of the substrate 100 in at least the first region 105. In addition, the protective member 400 may further cover at least a portion of the first surface 181 of the covering member 180 on the side opposite to the substrate 100. In addition, the protective member 400 may further cover a portion of the substrate 100 other than the first region 105.

Figure 6:
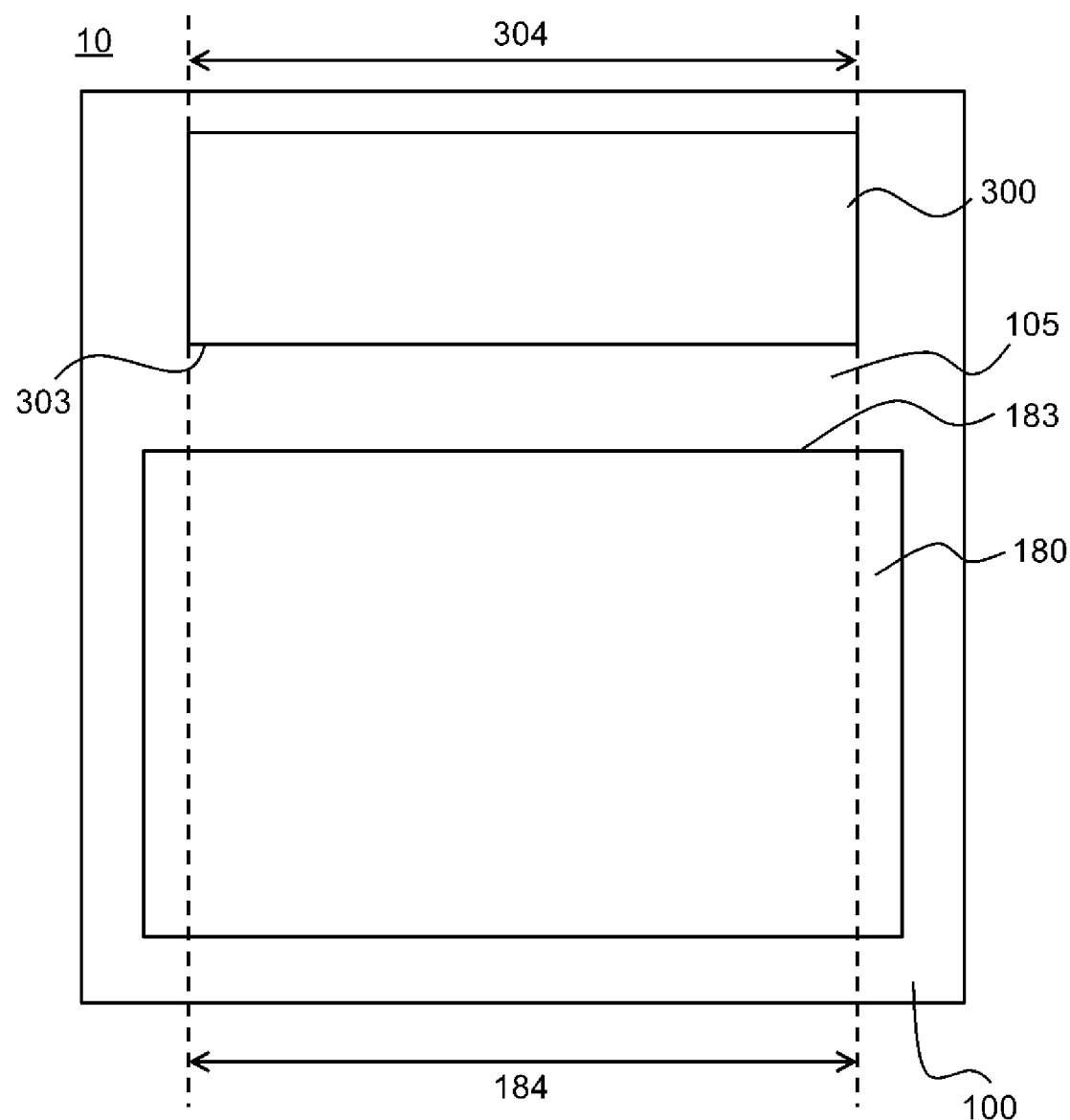
FIG. 6 is a plan view of an example of a positional relationship between a covering member and an integrated circuit.
Figure 7:
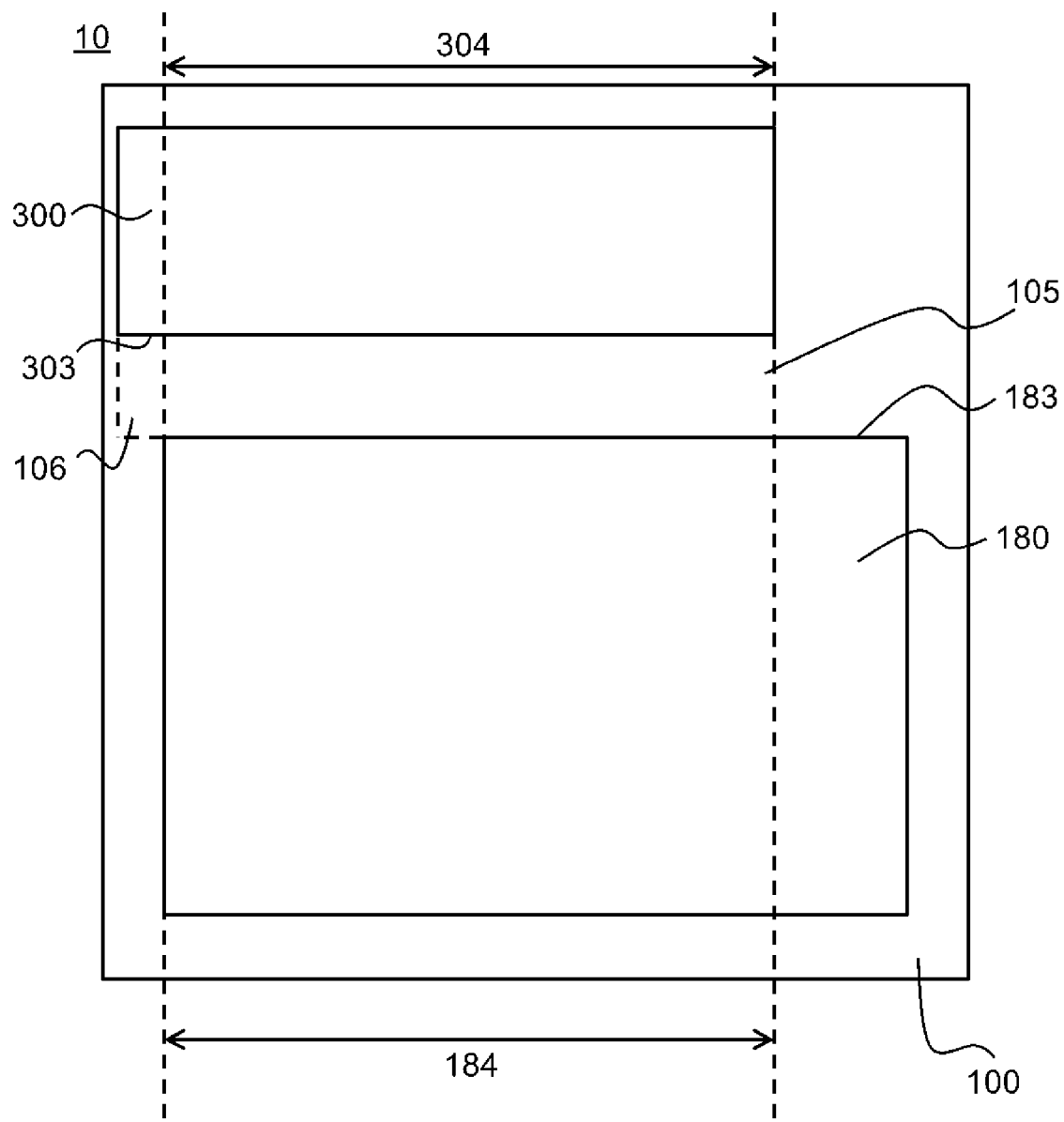
FIG. 7 is a plan view of an example of a positional relationship between a covering member and an integrated circuit.
Figure 8:
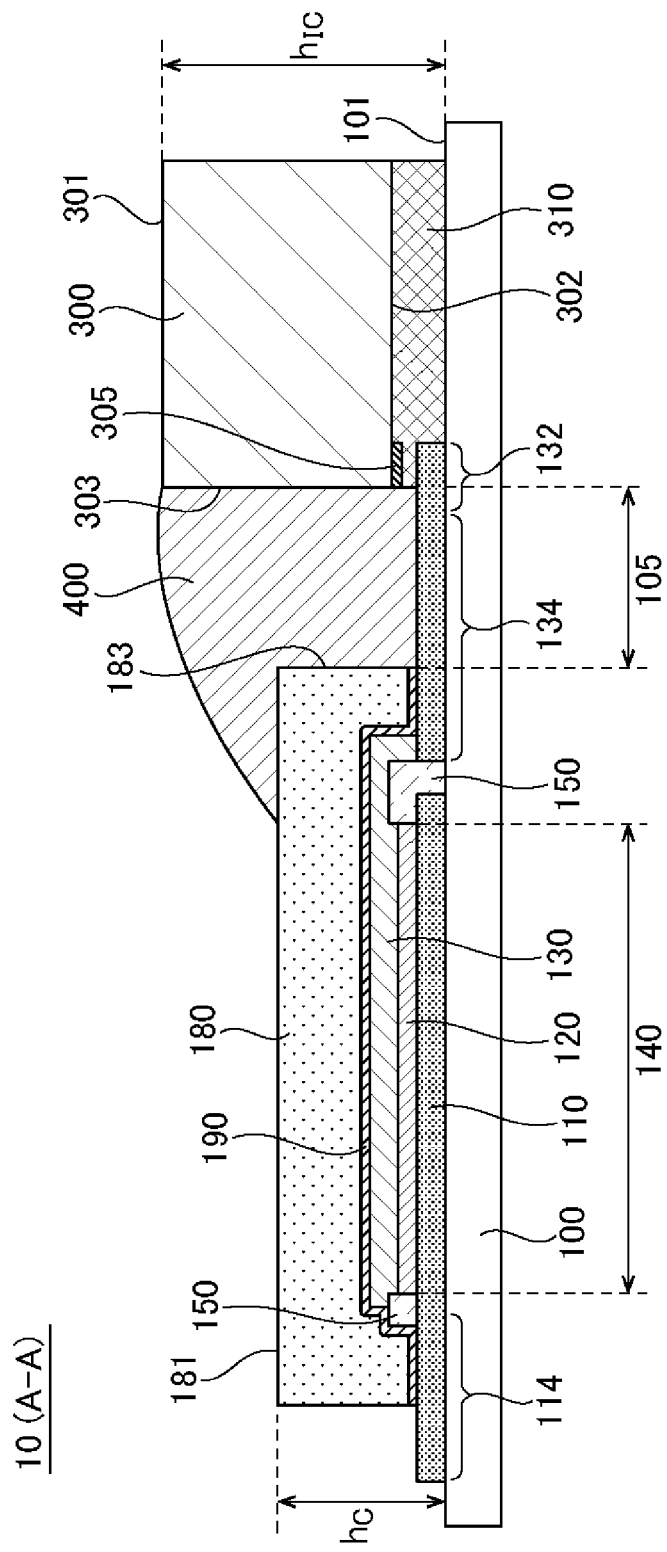
FIG. 8 is a cross-sectional view of a modification example of a light-emitting device.

FIG. 6 and FIG. 7 are plan views of examples of a positional relationship between the covering member 180 and the integrated circuit 300. The first region 105 is described referring to FIG. 6 and FIG. 7. In the example shown in the drawings, a main member of the integrated circuit 300 (for example, the inorganic material such as silicon) and the covering member 180 are rectangular when viewed from the direction perpendicular to the substrate. Meanwhile, the integrated circuit 300 may include a lead or the like in addition to the main member. It may be said that the first region 105 is a rectangular region having a portion 304 of sides of the integrated circuit 300 that faces the covering member 180, and a portion 184 of sides of the covering member 180 that faces the integrated circuit 300, as two opposing sides. FIG. 6 illustrates an example of the entirety of a side surface 303 of the integrated circuit 300 facing a side surface 183 of the covering member 180, and FIG. 7 illustrates an example of only a portion of the side surface 303 facing the side surface 183 of the covering member 180.

Meanwhile, as illustrated in FIG. 7, in a case where only a portion of the side surface 303 faces the side surface 183 of the covering member 180 the protective member 400 preferably covers the entirety of the second region 106 in addition to the first region 105. Here, the second region 106 is a rectangular region which is adjacent to the first region 105. Further, a side of the second region 106 is a side of the first region 105 that is perpendicular to the side surface 303 of the integrated circuit 300, and the other side of the second region 106 is a line which connects one corner of the integrated circuit 300 and an end of the portion 304.

The protective member 400 is formed using, for example, an epoxy-based resin, an acrylic-based resin, or the like. After fixing the covering member 180 and the integrated circuit 300 on the first surface 101 of the substrate 100, the protective member 400 can be formed by applying and solidifying a resin material. The protective member 400 preferably includes moderate resilience and flexibility in a solidified state.

In the light-emitting device 10 according to the present the embodiment, the protective member 400 covers the above-mentioned first region 105 out of the first surface 101 of the substrate 100, thereby reducing a stress concentrated on the first region 105 of the substrate 100 when the substrate 100 is curved and preventing cracks or the like from occurring in the substrate 100. Therefore, it is possible to improve durability of the light-emitting device 10.

Referring back to FIG. 1, the protective member 400 is further explained. The protective member 400 is preferably in contact with at least one side surface 303 of the integrated circuit 300 that is perpendicular to the first surface 301. Further, when the height from the first surface 101 of the substrate 100 to the first surface 301 of the integrated circuit 300 is $h_{IC}$, the protective member 400 further preferably covers a region in the side surface 303 of the integrated circuit 300 from the first surface 101 of the substrate 100 to a height $h_{IC}/2$. As a result, a stress concentrated on the first region 105 of the substrate 100 when the substrate 100 is curved is further reduced, thereby improving the durability of the light-emitting device 10.

Moreover, the protective member 400 is provided so as to expose the entirety of the first surface 301 of the integrated circuit 300 on the side opposite to the substrate 100. By doing so, it is possible to avoid thickening the light-emitting device 10 as a whole due to the light-emitting unit 140. Here, the first surface 301 of the integrated circuit 300 preferably has water repellency. Specifically, a contact angle of the first surface 301 of the integrated circuit 300 with respect to water is preferably equal to or greater than 90 degrees, and more preferably, equal to or greater than 150 degrees. For example, the first surface 301 may be provided with water repellency by applying water repellent processing or a water repellent coating to the surface of the integrated circuit 300. Then, when forming the protective member 400 by a coating method, the first surface 301 of the integrated circuit 300 repels the resin material. Therefore, the light-emitting device 10 can be manufactured efficiently while preventing the first surface 301 from being covered by the protective member 400. Meanwhile, the side surface 303 of the integrated circuit 300 may or may not have water repellency.

Meanwhile, the protective member 400 is preferably in contact with the first surface 101 of the substrate 100 in the entirety of the first region 105. However, in the first region 105, in a case where a covering layer or the like is formed on the first region 101 of the substrate 100, the protective member 400 need not be in contact with the first region 101 of the substrate 100.

FIG. 8 to FIG. 11 are cross-sectional views illustrating a modification example of the light-emitting device 10. FIG. 8 to FIG. 11 correspond to FIG. 1. In the example illustrated in FIG. 8, a surface of the protective member 400 projects toward the opposite side of the first surface 101 of the light-emitting device 10. Further, the protective member 400 covers at least a portion of the first surface 181 of the covering member 180.

Figure 9:
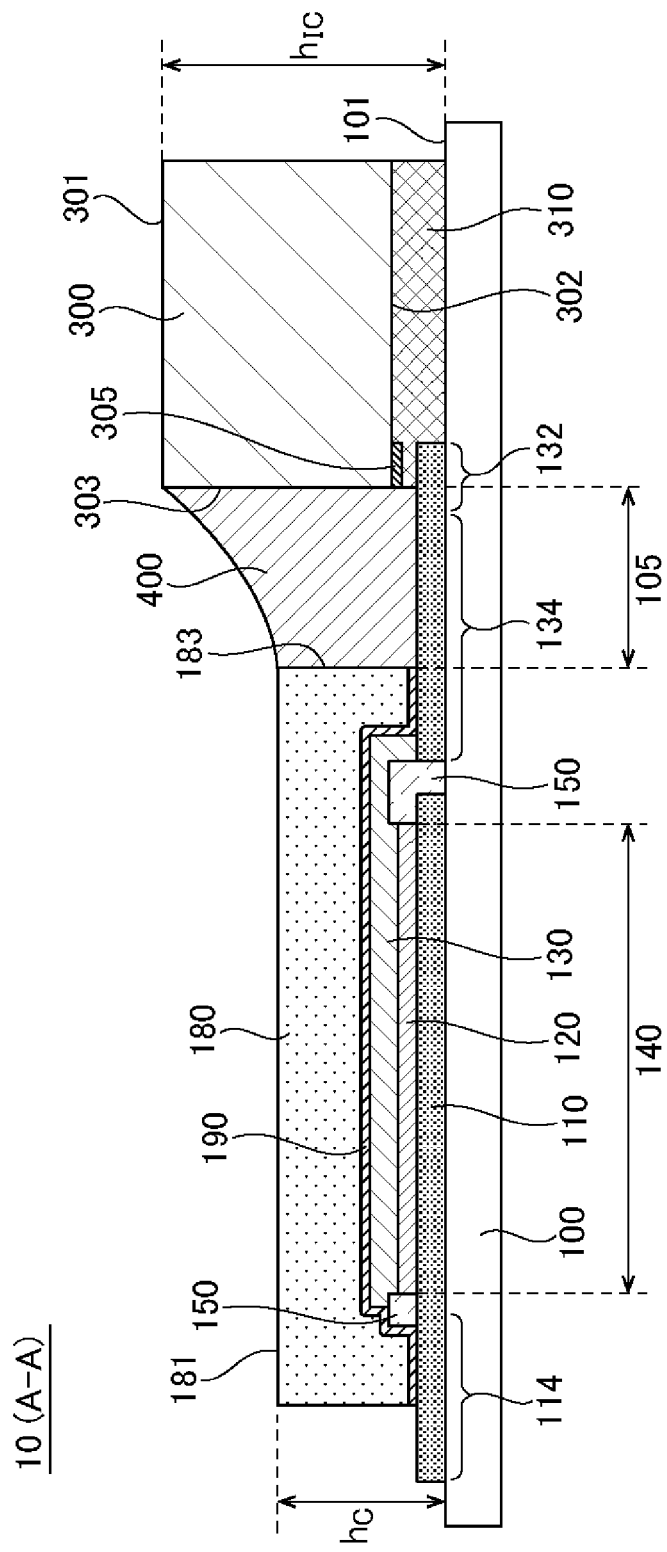
FIG. 9 is a cross-sectional view of a modification example of a light-emitting device.

In the example illustrated in FIG. 9, the surface of the protective member 400 is concaved toward the opposite side of the first surface 101 of the light-emitting device 10. Moreover, the protective member 400 does not cover any of the first surface 301 of the integrated circuit 300 and the first surface 181 of the covering member 180.

Figure 10:
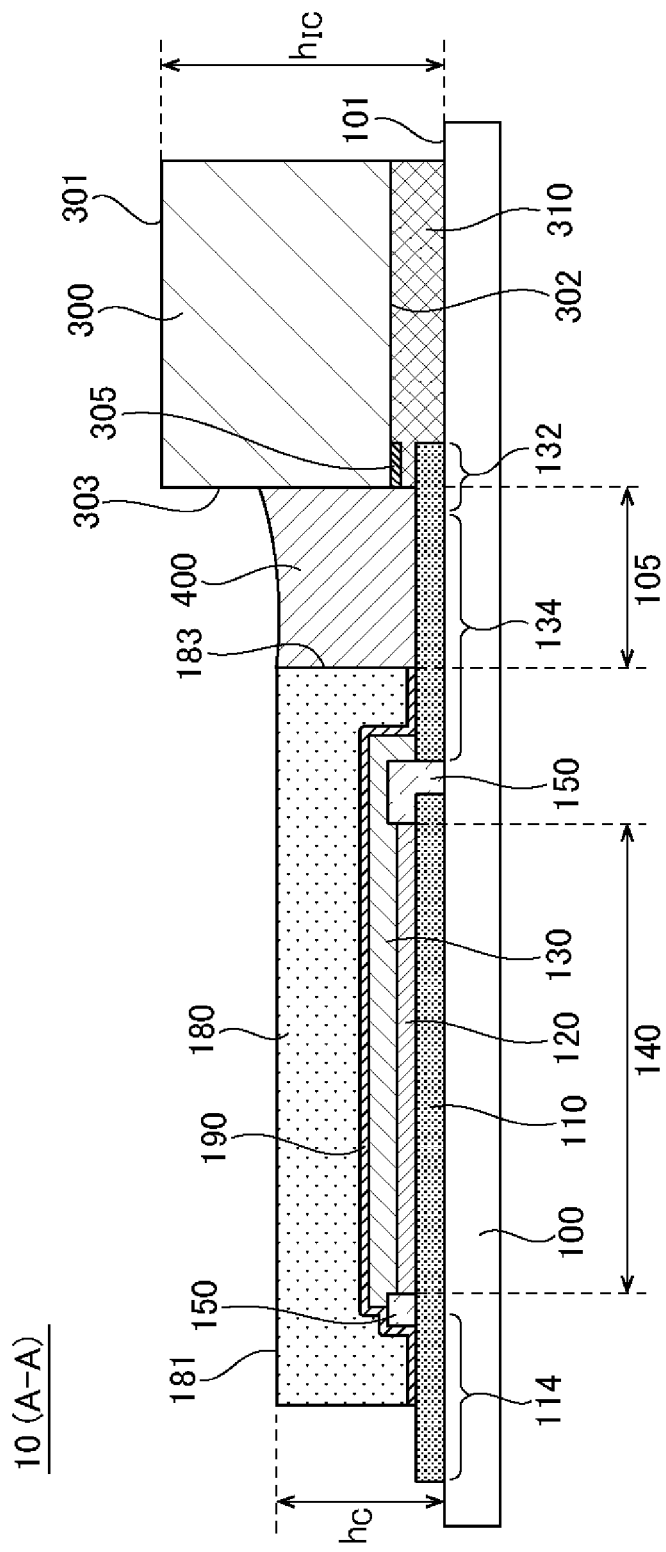
FIG. 10 is a cross-sectional view of a modification example of a light-emitting device.

In the example illustrated in FIG. 10, the protective member 400 covers only a portion of the side surface 303 of the integrated circuit 300. In the example in the present drawing, the protective member 400 covers at least a region of the side surface 303 of the integrated circuit 300 from the first surface 101 of the substrate 100 to the height $h_{IC}/2$.

Figure 11:
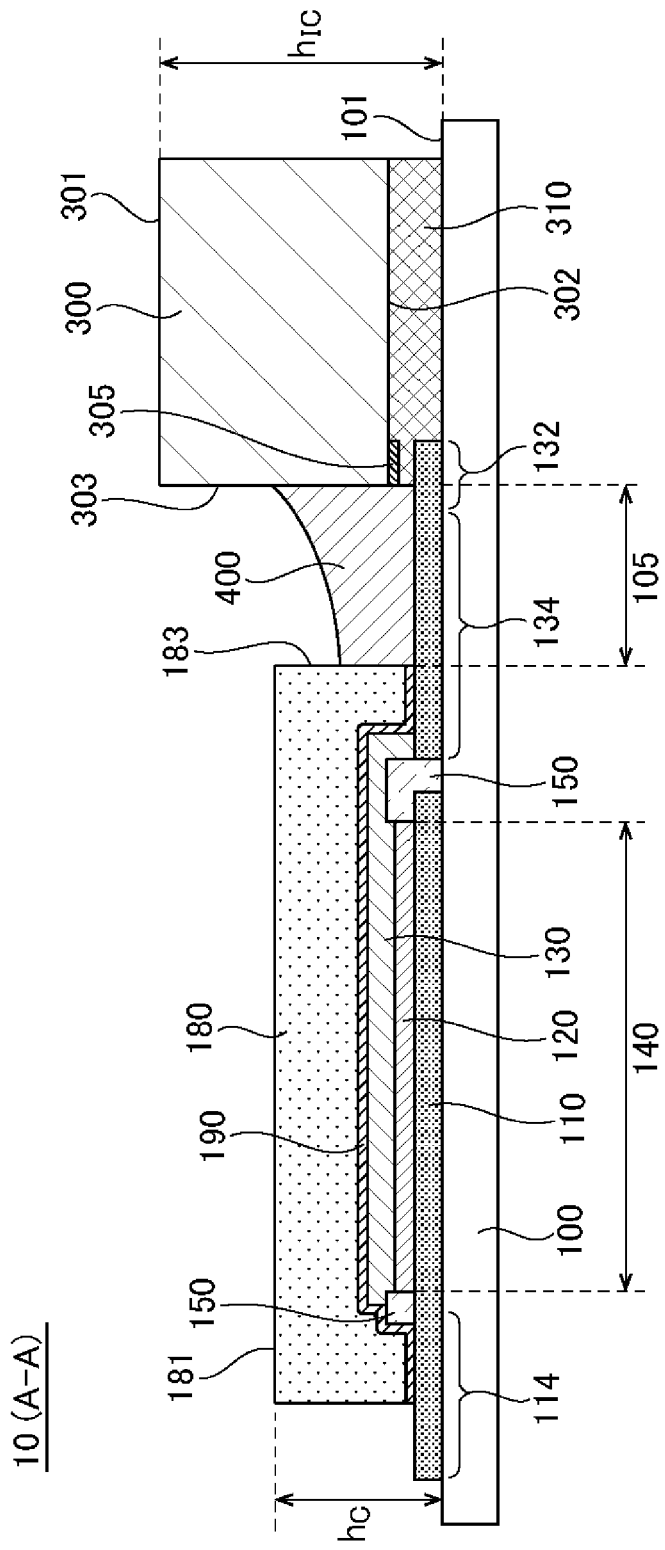
FIG. 11 is a cross-sectional view of a modification example of a light-emitting device.

In the example illustrated in FIG. 11, the protective member 400 covers only a portion of the side surface 183 of the covering member 180. Further, the protective member 400 covers only a portion of the side surface 303 of the integrated circuit 300. In the example in the present drawing, the protective member 400 covers at least a region of the side surface 183 of the covering member 180 from the first surface 101 of the substrate 100 to a height $h_C/2$, and at least the region in the side surface 303 of the integrated circuit 300 from the first surface 101 of the substrate 100 to a height $h_{IC}/2$.

As explained in these modification examples, the shape of the protective member 400 may be different according to the viscosity or a coating amount of the resin material that forms the protective member 400, wettability of the surfaces of the integrated circuit 300 and the covering member 180, and the like.

In these modification examples also, the protective member 400 covers the above-mentioned first region 105 in the first surface 101 of the substrate 100, thereby reducing a stress concentrated on the first region 105 of the substrate 100 when the substrate 100 is curved and preventing cracks or the like from occurring in the substrate 100. Therefore, it is possible to improve the durability of the light-emitting device 10.

A method for manufacturing the light-emitting device 10 will be described below. The manufacturing method includes forming the light-emitting unit 140, providing the integrated circuit 300 on the first surface 101 of the substrate 100, covering the light-emitting unit 140 with the covering member 180, and forming the protective member 400. In the step of forming the light-emitting unit 140, the light-emitting unit 140 including the first electrode 110, the organic layer 120, and the second electrode 130 is formed on the first surface 101 of the substrate 100. In the step of providing the integrated circuit 300, the integrated circuit 300 is electrically connected to at least one of the first electrode 110 and the second electrode 130. In the step of forming the protective member 400, the protective member is formed in the first region 105 between the covering member 180 and the integrated circuit 300. Further, in the step of forming the protective member 400, the protective member 400 is provided so as to expose the entirety of the first surface 301 of the integrated circuit 300 on the side opposite to the substrate 100. A detailed description will be provided below.

First, the first electrode 110 is formed on the first surface 101 of the substrate 100. In this step, the first terminal 112 and the second terminal 132 are also formed. Next, the insulating film 150, the organic layer 120, and the second electrode 130 are formed in this order (the step of forming the light-emitting unit 140).

Next, the anisotropic conductive resin layer 310 is formed over a range over the first surface 101 of the substrate 100 including the first terminal 112 and the second terminal 132 which is a range in which the integrated circuit 300 is disposed. In addition, the integrated circuit 300 is disposed and fixed on the first surface 101 of the substrate 100 with the anisotropic conductive resin layer 310 interposed therebetween. At this time, the first terminal 112 and the second terminal 132 are electrically connected to the electrode 305 of the integrated circuit 300 through the plurality of conductive particles (the step of providing the integrated circuit 300). Meanwhile, the conductivity of the anisotropic conductive resin layer 310 in a direction parallel to the substrate 100 is low, so that the first terminal 112 and the second terminal 132 are prevented from short-circuiting.

Next, the sealing film 190 and the covering member 180 are formed over the first surface 101 of the substrate 100 so as to cover the light-emitting unit 140 (the step of covering the light-emitting unit).

Next, the resin material is applied and solidified to form the protective member 400 in the first region 105 between the covering member 180 and the integrated circuit 300 (the step of forming the protective member 400). The resin material may be applied only in the desired region using, for example, a dispenser or the like.

Meanwhile, after the step of providing the integrated circuit 300 and before the step of forming the protective member 400, a step of applying a water repellent treatment to at least the first surface 301 of the integrated circuit 300 may be additionally included. Then, the first surface 301 of the integrated circuit 300 repels the resin material, thereby the light-emitting device 10 may be manufactured efficiently while preventing the first surface 301 from being covered by the protective member 400.

The light-emitting device 10 may be used not only when the substrate 100 is in a flat state but also when at least a portion of the substrate 100 is in a curved state. In addition, in the light-emitting device 10, the substrate 100 may be fixed having at least a portion thereof in a curved state.

Figure 12:
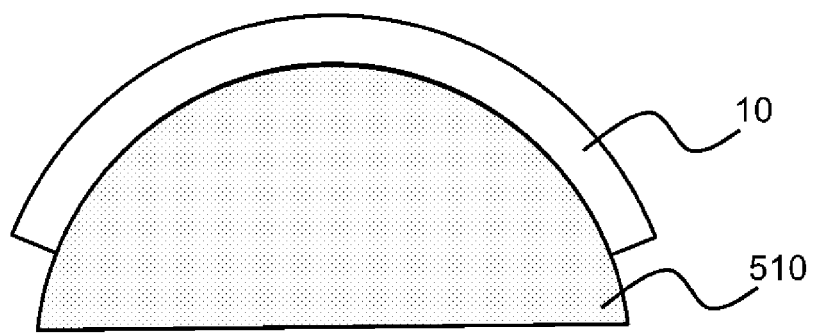
FIG. 12 is a cross-sectional view of a configuration of an electronic device including a light-emitting device.

FIG. 12 is a cross-sectional view of a configuration of an electronic device 50 including the light-emitting device 10. In the electronic device 50, at least a portion of the substrate 100 is curved. The electronic device 50 includes a fixing member 510, and the light-emitting device 10 is fixed to the fixing member 510 with the substrate 100 in a curved state. The electronic device 50 is, for example, a billboard, a mobile terminal (including a wearable terminal), or the like.

As stated above, according to the present embodiment, the protective member 400 is provided in the first region 105 between the covering member 180 and the integrated circuit 300. Therefore, it is possible to reduce the stress concentrated on the first region 105 of the substrate 100 when the substrate 100 is curved, and to prevent cracks or the like from occurring in the substrate 100. Thus, it is possible to improve the durability of the light-emitting device 10.

In addition, the protective member 400 is provided so as to expose the entirety of the first surface 301 of the integrated circuit 300 on the side opposite to the substrate 100. Therefore, it is possible to avoid thickening the light-emitting device 10 as a whole due to the light-emitting unit 140.

EXAMPLE 1

Figure 13:
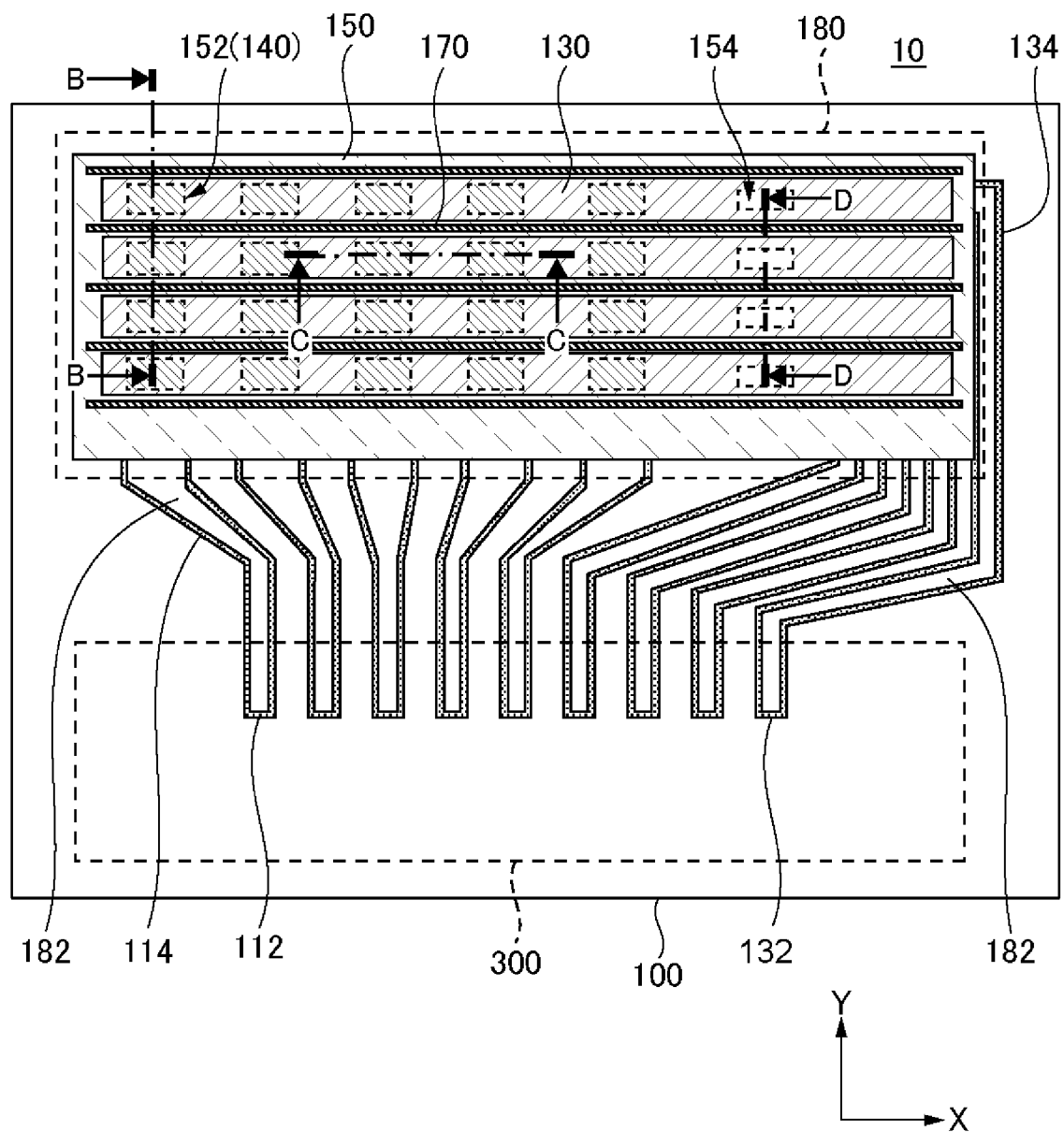
FIG. 13 is a diagram in which a protective member, a covering member, and an integrated circuit are removed from FIG. 18.
Figure 14:
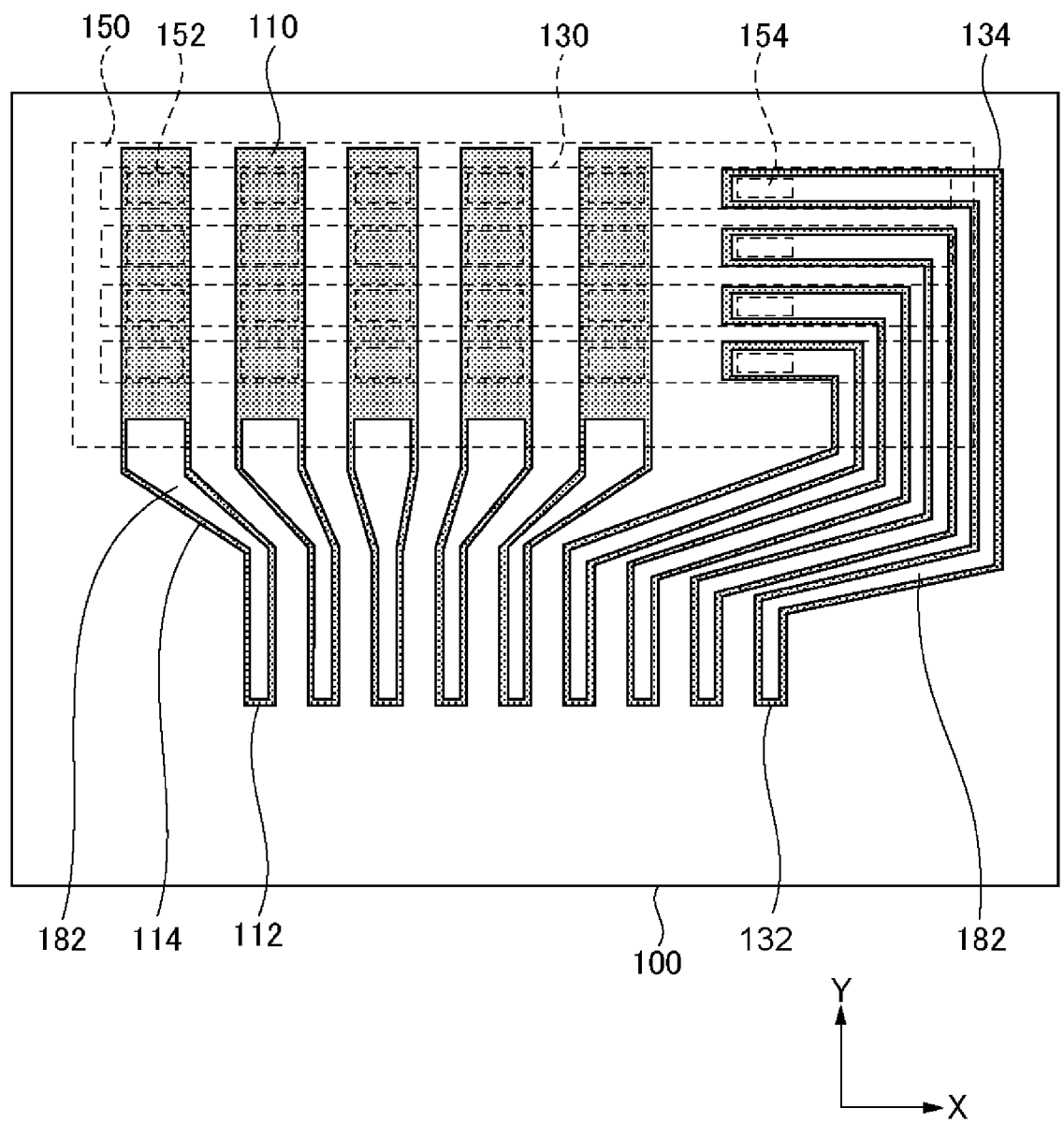
FIG. 14 is a diagram in which a partition wall, a second electrode, an organic layer, and an insulating layer are removed from FIG. 13.
Figure 15:
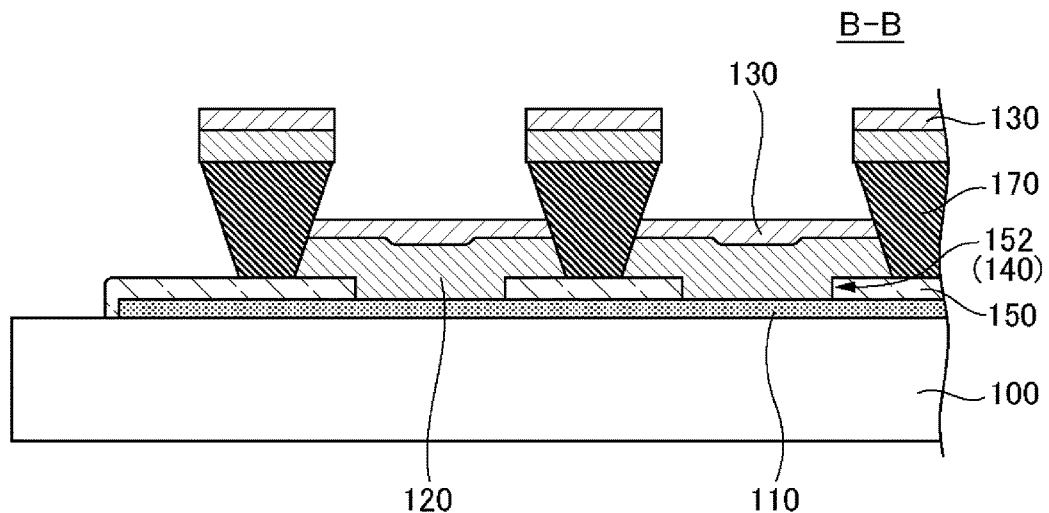
FIG. 15 is a cross-sectional view taken along line B-B of FIG. 13.
Figure 16:
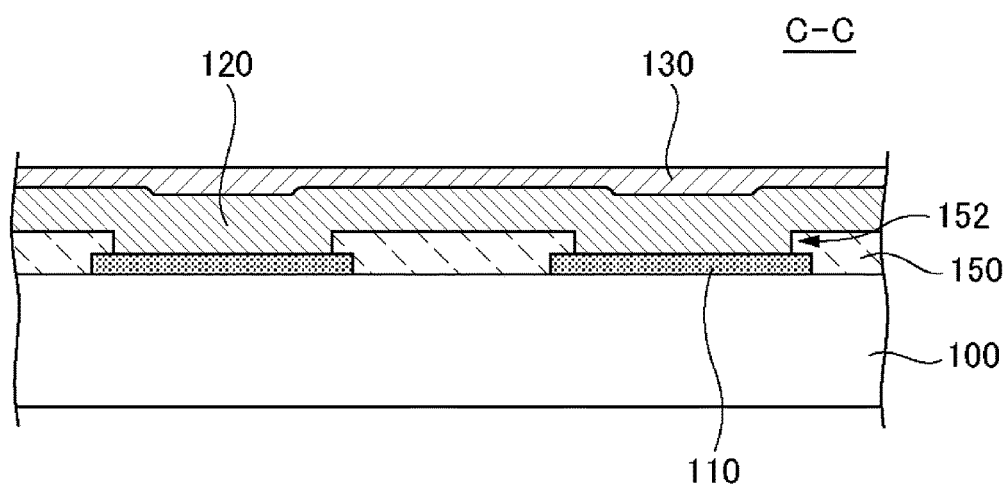
FIG. 16 is a cross-sectional view taken along line C-C of FIG. 13.
Figure 17:
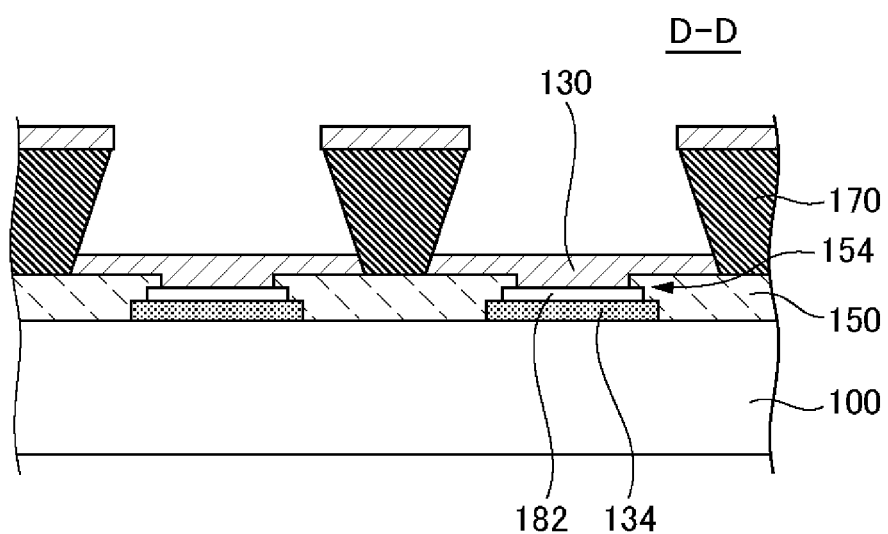
FIG. 17 is a cross-sectional view taken along line D-D of FIG. 13.
Figure 18:
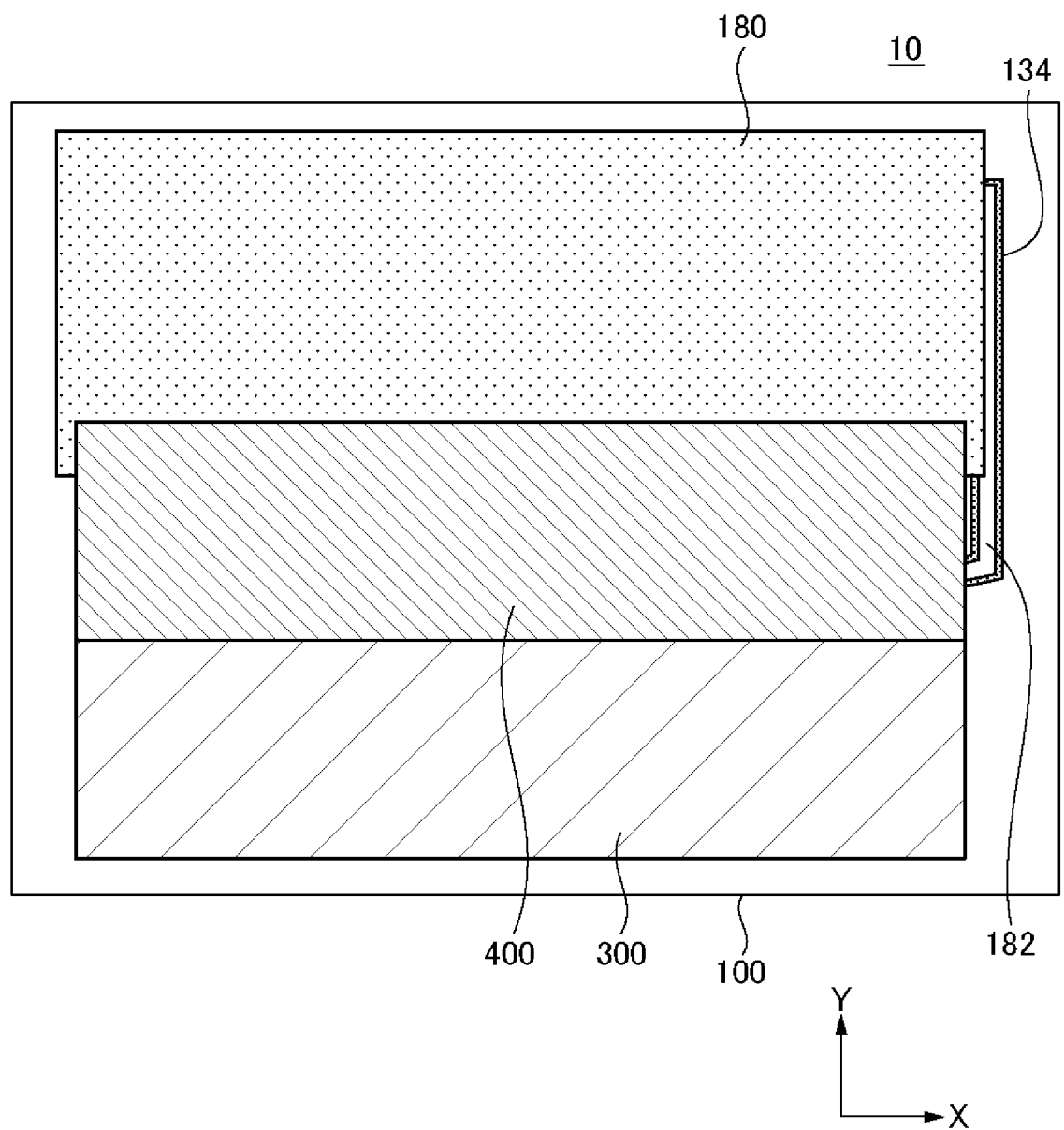
FIG. 18 is a plan view of a configuration of a light-emitting device according to Modification Example 1.

FIG. 18 is a plan view of a configuration of a light-emitting device 10 according to Example 1. The light-emitting device 10 according to the present example is the same as the light-emitting device 10 according to the embodiment, except a point described below. FIG. 13 is a diagram in which a protective member 400, a covering member 180, and an integrated circuit 300 are removed from FIG. 18. In the present drawing, the covering member 180 and the integrated circuit 300 are illustrated with a dotted line. FIG. 14 is a diagram in which a partition wall 170, a second electrode 130, an organic layer 120, and an insulating film 150 are removed from FIG. 13. FIG. 15 is a cross-sectional view taken along line B-B of FIG. 13, FIG. 16 is a cross-sectional view taken along line C-C of FIG. 13, and FIG. 17 is a cross-sectional view taken along line D-D of FIG. 13. However, in FIG. 15 to FIG. 17, a sealing film 190 and the covering member 180 are not shown.

The light-emitting device 10 according to the present example is a display including a substrate 100, a first electrode 110, a light-emitting unit 140, an insulating layer 150, plural openings 152, plural openings 154, plural first extraction interconnects 114, an organic layer 120, a second electrode 130, plural second extraction interconnects 134, and plural partition walls 170.

The first electrode 110 extends linearly in the first direction (in the Y direction in FIG. 13). An end of the first electrode 110 is connected to the first extraction interconnect 114.

The first extraction interconnect 114 connects the first electrode 110 to a first terminal 112. In the example shown in the drawing, a one end side of the first extraction interconnect 114 is connected to the first electrode 110 and the other end side of the first extraction interconnect 114 serves as the first terminal 112. Further, a conductive layer 182 is formed over the first terminal 112 and on the first extraction interconnect 114. The conductive layer 182 is formed using a material having resistance lower than that of the first electrode 110, and is, for example, Al or Ag. Meanwhile, a portion of the first extraction interconnect 114 is covered by the insulating layer 150.

The insulating layer 150 is, as shown in FIG. 13, and FIG. 15 to FIG. 17, formed on plural first electrodes 110 and also in regions therebetween. The plural openings 152 and the plural openings 154 are formed in the insulating layer 150. Plural second electrodes 130 extend in parallel to each other in a direction intersecting the first electrodes 110 (for example, a direction orthogonal to X direction in FIG. 13). The partition wall 170, to be explained in detail later, extends between the plural second electrodes 130. The opening 152 is located at an intersection point between the first electrode 110 and the second electrode 130 when seen in a planar view. Specifically, the plural openings 152 are aligned in the extending direction of the first electrodes 110 (Y direction in FIG. 13). Moreover, the plural openings 152 are also aligned in the extending direction of the second electrodes 130 (X direction in FIG. 13). Therefore, the plural openings 152 are disposed so as to constitute a matrix.

Each opening 154 is located in a region overlapping a one end side of each of the plural second electrodes 130 when seen in a planar view. In addition, the openings 154 are disposed along one side of the matrix constituted by the openings 152. When seen in a direction along this one side (for example, Y direction in FIG. 13, that is, a direction along the first electrodes 110), the openings 154 are disposed at a predetermined interval. A portion of the second extraction interconnects 134 are exposed from the openings 154. The second extraction interconnects 134 are connected to the second electrodes 130 through the openings 154.

The second extraction interconnect 134 is for connecting the second electrode 130 to the second terminal 132 and includes a layer constituted of the same material as that of the first electrode 110. A one end side of the second extraction interconnect 134 is located below the opening 154, and the other end side of the second extraction interconnect 134 is extracted to the outside of the insulating layer 150. In the example shown in the present drawing, the other end side of the second extraction interconnect 134 serves as the second terminal 132. Meanwhile, a portion of the second extraction interconnect 134 is covered by the insulating layer 150.

The organic layer 120 is formed in a region overlapping the openings 152. A hole injection layer of the organic layer 120 is in contact with the first electrode 110, and an electron injection layer of the organic layer 120 is in contact with the second electrode 130. Therefore, the light-emitting unit 140 is located in each region overlapping the opening 152.

Meanwhile, in each of examples shown in FIG. 15 and FIG. 16, each layer configuring the organic layer 120 protrudes to the outside of the opening 152. As shown in FIG. 13, the organic layer 120 may or may not be continuously formed between adjacent openings 152 in the extending direction of the partition wall 170. However, as shown in FIG. 17, the organic layer 120 is not formed over the openings 154.

The second electrode 130 extends in a second direction (X direction in FIG. 13) intersecting the first direction as illustrated in FIG. 13 and FIG. 15 to FIG. 17. The partition wall 170 is formed between adjacent second electrodes 130. The partition wall 170 extends in parallel to the second electrode 130, that is, in the second direction. The foundation of the partition wall 170 is, for example, the insulating layer 150. The partition wall 170 is a photosensitive resin such as, for example, a polyimide-based resin and the like, formed in a predetermined pattern by undergoing exposure and development. Meanwhile, the partition wall 170 may also be constituted of a resin other than a polyimide-based resin, for example, an epoxy resin or an acrylic resin, or an inorganic material such as a silicon dioxide or the like.

The cross-sectional shape of the partition wall 170 is a trapezoid turned upside down (an inverted trapezoid). That is, the width of the upper surface of the partition wall 170 is larger than the width of the lower surface thereof. For this reason, when the partition walls 170 are formed before the second electrodes 130, the plural second electrodes 130 can be formed at one time by forming the second electrode 130 on one surface side of the substrate 100 using vapor deposition or sputtering. Moreover, the partition walls 170 have a function of partitioning the organic layer 120.

Next, a method for manufacturing the light-emitting device 10 in the present example is explained. The method for manufacturing the light-emitting device 10 according to the present example is the same as that of the light-emitting device 10 according to the embodiment, except the step of forming the light-emitting unit 140. First, the first electrode 110, the first extraction interconnect 114, and the second extraction interconnect 134 are formed on the substrate 100. The methods for forming the above are the same as the method for forming the first electrode 110 in the embodiment.

Next, the insulating film 150 is formed, and additionally, the partition wall 170 is formed. Next, the organic layer 120 and the second electrode 130 are formed.

Then, hereafter, the same as the method in the embodiment, a step of providing the integrated circuit 300, a step of covering the light-emitting unit 140, and a step of forming the protective member 400 are performed.

According to the present example, the same as the embodiment, the protective member 400 is provided in a first region 105 between the covering member 180 and the integrated circuit 300. Therefore, a stress concentrated on the first region 105 of the substrate 100 when the substrate 100 is curved is reduced, and it is possible to prevent cracks or the like from occurring in the substrate 100. Thus, it is possible to improve durability of the light-emitting device 10.

In addition, the protective member 400 is provided so as to expose the entirety of a first surface 301 of the integrated circuit 300 on the side opposite to the substrate 100. Therefore, it is possible to avoid thickening the light-emitting device 10 as a whole due to the light-emitting unit 140.

As described above, although the embodiment and examples of the present invention have been set forth with reference to the accompanying drawings, they are merely illustrative of the present invention, and various configurations other than those stated above can be adopted.

The invention claimed is:

1. A light-emitting device comprising:
   a substrate;
   a light-emitting unit provided on one surface of the substrate, the light-emitting unit comprising a first electrode, an organic layer, and a second electrode;
   a covering member that covers the light-emitting unit;
   an integrated circuit disposed on the one surface, the integrated circuit electrically connected to at least one of the first electrode and the second electrode; and
   a protective member located in a region between the covering member and the integrated circuit,
   wherein the protective member is provided to expose an entirety of a first surface of the integrated circuit on a side opposite to the substrate, and
   wherein the protective member covers at least a portion of a surface of the covering member on a side opposite to the substrate.

2. The light-emitting device according to claim 1, further comprising a terminal formed on the one surface, the terminal electrically connected to the first electrode and the second electrode,
   wherein the terminal is connected to the integrated circuit.

3. The light-emitting device according to claim 1,
   wherein the protective member covers an entirety of at least the region.

4. The light-emitting device according to claim 1,
   wherein a height from the one surface to a surface of the covering member on a side opposite to the substrate is lower than a height from the one surface to the first surface.

5. The light-emitting device according to claim 1,
   wherein the first surface has water repellency.

6. The light-emitting device according to claim 5,
   wherein the water repellency of the first surface is configured to repel water contacting the first surface at an angle of equal to or greater than 90 degrees.

7. The light-emitting device according to claim 6,
   wherein the water repellency of the first surface is configured to repel water contacting the first surface at an angle of equal to or greater than 150 degrees.

8. The light-emitting device according to claim 1,
   wherein the protective member is in contact with at least one side surface of the integrated circuit that is perpendicular to the first surface.

9. The light-emitting device according to claim 8,
   wherein when a height from the one surface to the first surface is $h_{IC}$, the protective member covers a region of the side surface of the integrated circuit from the one surface to a height $h_{IC}/2$.

10. The light-emitting device according to claim 1,
    wherein the substrate is a glass substrate.

11. The light-emitting device according to claim 1,
    wherein a thickness of the substrate is equal to or greater than 10 μm and equal to or less than 1,000 μm.

12. The light-emitting device according to claim 1,
    wherein the substrate has flexibility.

13. An electronic device comprising the light-emitting device according to claim 1,
    wherein at least a portion of the substrate is curved.

14. A method for manufacturing a light-emitting device comprising the steps of:
    forming a light-emitting unit on one surface of a substrate, the light-emitting unit comprising a first electrode, an organic layer, and a second electrode;
    providing an integrated circuit on the one surface, the integrated circuit electrically connected to at least one of the first electrode and the second electrode;
    covering the light-emitting unit with a covering member; and
    forming a protective member in a region between the covering member and the integrated circuit,
    wherein in the step of forming the protective member, the protective member is provided so as to expose an entirety of a first surface of the integrated circuit on a side opposite to the substrate, and the protective member covers at least a portion of a surface of the covering member on a side opposite to the substrate.

* * * * *